United States Patent
Liu et al.

(10) Patent No.: US 8,956,948 B2
(45) Date of Patent: Feb. 17, 2015

(54) SHALLOW TRENCH ISOLATION EXTENSION

(75) Inventors: Yanxiang Liu, Beacon, NY (US); Bin Yang, Mahwah, NJ (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 749 days.

(21) Appl. No.: 12/783,914

(22) Filed: May 20, 2010

(65) Prior Publication Data
US 2011/0284985 A1    Nov. 24, 2011

(51) Int. Cl.
*H01L 21/76* (2006.01)
*H01L 21/762* (2006.01)

(52) U.S. Cl.
CPC .... *H01L 21/76229* (2013.01); *H01L 21/76237* (2013.01)
USPC ........... 438/418; 438/133; 438/434; 438/447; 438/199; 438/207

(58) Field of Classification Search
CPC ............. H01L 21/823878; H01L 29/7813; H01L 21/26533; H01L 21/76237; H01L 21/76267; H01L 21/823481; H01L 29/407
USPC ......... 438/423–427, 418, 433–434, 447, 199, 438/206–209, 212, 218
See application file for complete search history.

(56) References Cited

U.S. PATENT DOCUMENTS

| | | | | |
|---|---|---|---|---|
| 5,770,504 A | * | 6/1998 | Brown et al. | 438/296 |
| 5,783,476 A | * | 7/1998 | Arnold | 438/425 |
| 6,432,798 B1 | * | 8/2002 | Liu et al. | 438/433 |
| 6,680,239 B1 | * | 1/2004 | Cha et al. | 438/435 |
| 2007/0241409 A1 | * | 10/2007 | Furukawa et al. | 257/372 |
| 2010/0038744 A1 | * | 2/2010 | Li et al. | 257/510 |
| 2011/0081766 A1 | * | 4/2011 | Liu et al. | 438/424 |

OTHER PUBLICATIONS

Rangineni, Yaswanth, "SOI Wafer Fabrication techniques: SIMOX and Smart Cut", Jun. 15, 2006, from http://web.cecs.pdx.edu/~ranginey/index_files/page0002.html.

* cited by examiner

*Primary Examiner* — H. Jey Tsai
(74) *Attorney, Agent, or Firm* — Ditthavong & Steiner, P.C.

(57) ABSTRACT

A semiconductor device is formed with extended STI regions. Embodiments include implanting oxygen under STI trenches prior to filling the trenches with oxide and subsequently annealing. An embodiment includes forming a recess in a silicon substrate, implanting oxygen into the silicon substrate below the recess, filling the recess with an oxide, and annealing the oxygen implanted silicon. The annealed oxygen implanted silicon extends the STI region, thereby reducing leakage current between N+ diffusions and N-well and between P+ diffusions and P-well, without causing STI fill holes and other defects.

16 Claims, 4 Drawing Sheets

US 8,956,948 B2

SHALLOW TRENCH ISOLATION EXTENSION

TECHNICAL FIELD

The present disclosure relates to CMOS semiconductor devices with improved shallow trench isolation. The present disclosure is particularly applicable to semiconductors 22 nanometer (nm) technology nodes and beyond.

BACKGROUND

Adverting to FIG. 1, as reductions in device scaling continue, spacing between PMOS and NMOS diffusions 101 and 103 shrinks, causing increasing leakage between NMOS diffusion 103 and N-well 105 and between PMOS diffusion 101 and P-well 107. The leakage is particularly problematic for bulk CMOS devices at the 22 nm technology node and beyond. One critical leakage path 109 occurs in the 6-Transistor SRAM cell (shown with two PMOS devices 111 and 113 and two NMOS devices 115 and 117), though similar leakage problems occur in logic devices, IO devices, and other types of circuits. In the exemplary SRAM cell, the minimum spacing between NMOS and PMOS diffusions 101 and 103 has shrunk from 80 nm to 60 nm to 46 nm for the 45 nm-node, 32 nm-node, and 22 nm-node, respectively, thereby resulting in the failure of conventional shallow trench isolation (STI) to provide adequate isolation for 22 nm-node devices or smaller. For example, as illustrated in FIG. 2, under certain conditions, the N+/P-well/N-well bipolar transistor could be turned on if the P-well/N-well junction is forward biased (shown at 201), and, therefore, causes significant leakage through a path (203) underneath the STI region 205 between NMOS 207 and PMOS 29, all on bulk p substrate 211.

One conventional technique for reducing leakage across isolation wells is to increase the doses in the base region of the parasitic bipolar transistor. By increasing the N-well and P-well doses, the base Gummel number $G_B$ increases, where $$G_B = \int_0^W \frac{n_i^2}{n_{iB}^2} \frac{N_B}{D_B} dx,$$

with $n_i$ equal to the intrinsic carrier density, $n_{iB}$ equal to the effective intrinsic carrier density in the base of the bipolar transistor, $N_B$ equal to the base doping concentration, and $D_B$ equal to the base diffusion coefficient. Therefore, according to classic bipolar junction transistor (BJT) theory, the leakage through the parasitic BJT is suppressed. However, this method requires higher well implant doses, which increases the capacitance at the P+/N-well and N+/P-well junctions, thereby degrading the performance of the MOSFET.

Attempts have also been made to increase the STI trench depth from the conventional 225 nm to 265 nm at the critical N-well/P-well boundary. The extra 40 nm of STI leads to a wider base region of the parasitic BJT, resulting in a higher Gummel number, thereby improving isolation and reducing leakage current by 2 orders of magnitude. However, for 22 nm-node devices, the high aspect ratio (depth versus opening size) of about 6 makes the STI trench etch and fill process difficult, causing partially filled STI voids and other defects, which cause significant yield issues. For smaller devices, the aspect ratio will increase even further.

A need therefore exists for methodology enabling the formation of a CMOS device that can effectively suppress leakage current across isolation wells without etching and filling STI regions with extremely high aspect ratios, and for the resulting devices.

SUMMARY

An aspect of the present disclosure is an improved method of fabricating a semiconductor including an extended STI region.

Another aspect of the present disclosure is a semiconductor device including an extended STI region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming a recess in a silicon substrate; implanting oxygen into the silicon substrate below the recess; filling the recess with an oxide; and annealing the oxygen implanted silicon.

Aspects of the present disclosure include forming a liner on the sides and bottom of the recess before implanting oxygen. Further aspects include forming a capping layer on the substrate prior to forming the recess; and forming the recess in the capping layer and the substrate. Another aspect includes chemical mechanical polishing (CMP) the oxide subsequent to annealing; and removing the capping layer. Additional aspects include forming the recess by etching to a depth of 225 nanometers (nm). Other aspects include implanting oxygen to a depth of 20 nm to 50 nm below the recess. Further aspects include annealing at a temperature of 1200° C. to 1400° C. Another aspect includes implanting oxygen at an energy of 5 keV to 20 keV. Other aspects include implanting oxygen at a dose of 1E16 cm² to 1E17 cm². Additional aspects include depositing a liner of silicon nitride at a thickness of 2 nm to 3 nm.

Another aspect of the present disclosure is a semiconductor device comprising: a silicon substrate; an N+ diffusion in a P-well formed in the substrate; a P+ diffusion in an N-well formed in the substrate, closely spaced from the N+ diffusion; a shallow trench isolation (STI) region between the N+ and P+ diffusions, wherein the STI region comprises: a recess in the substrate to a depth of 225 nm; a liner on the sides and bottom of the recess; an oxide filling the remainder of the recess; and a silicon oxide extension region extending 20 nm to 50 nm below the recess.

Aspects include a semiconductor device including the silicon oxide extension region being formed by: implanting oxygen ions in the recess prior to filling with oxide; and annealing the oxygen implanted silicon. Further aspects include the spacing between the N+ and P+ diffusions being less than 60 nm. Other aspects include the liner comprising silicon nitride at a thickness of 2 nm to 3 nm.

Another aspect of the present disclosure is a method of fabricating a semiconductor device, the method comprising: forming an N+ diffusion in a P-well in a silicon substrate; forming a P+ diffusion in an N-well in the substrate, closely spaced from the N+ diffusion; forming a recess in the substrate to a depth of 225 nm; forming a liner on the sides and bottom of the recess; implanting oxygen into the substrate through the bottom of the recess; filling the recess with an oxide; and annealing the oxygen implanted silicon.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current leakage problem attendant upon forming a 22 nm-node or smaller CMOS device. In accordance with embodiments of the present disclosure, the STI region is extended downward into the silicon substrate by implanting oxygen through the STI recess and annealing the oxygen implanted silicon. Consequently, the STI region is extended without forming holes or voids during the oxide fill process. Therefore, current leakage is reduced without creating defects and yield issues.

Methodology in accordance with embodiments of the present disclosure includes forming a recess in a silicon substrate, forming a liner on the sides and bottom of the recess, implanting oxygen into the silicon substrate below the recess, filling the recess with an oxide, and annealing the oxygen implanted silicon.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A process for fabricating a semiconductor device in accordance with an embodiment of the present disclosure is illustrated in FIGS. 3A through 3H. Adverting to FIG. 3A, a pad silicon nitride (SiN) capping layer 301 is formed on a silicon substrate 303, with a thermal oxide liner 305 therebetween. SiN capping layer 301 may be deposited at a thickness of 55 nm. Thermal oxide liner 305 may be formed at a thickness of 5 nm.

Figure 1:
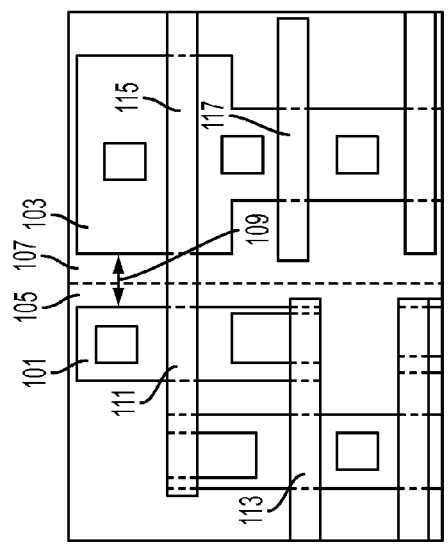
FIG. 1 schematically illustrates a prior art 6-Transistor SRAM cell.
Figure 2:
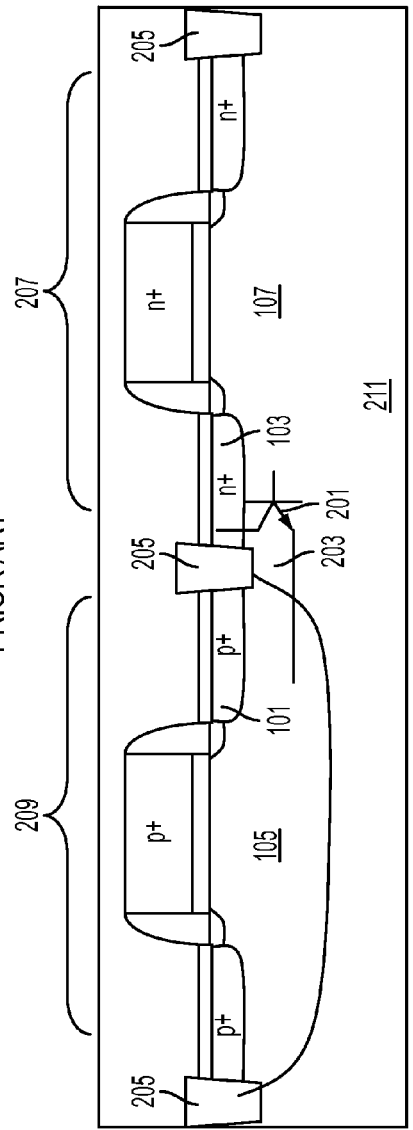
FIG. 2 schematically illustrates a N+/P-well/N-well bipolar transistor of the 6-Transistor SRAM cell of FIG. 1.
Figure 3A:
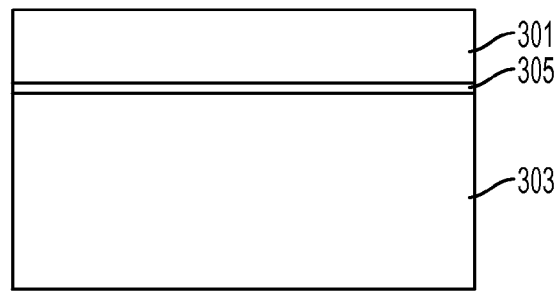
FIGS. 3A through 3H schematically illustrate sequential steps of a method in accordance with an exemplary embodiment.
Figure 3B:
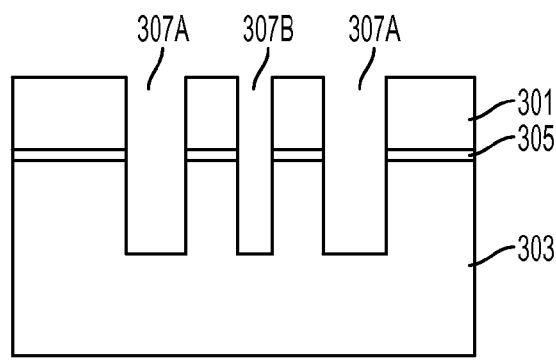

As illustrated in FIG. 3B, STI recesses 307A and 307B are formed in substrate 303, by a conventional method. Recesses 307A may be, for example, inside wells, whereas recesses 307B may be formed at critical leakage paths, such as at well boundaries. STI recesses 307A and 307B may be etched to a depth of 225 nm, for a total depth (including the oxide liner 305 and SiN capping layer 301) of 280 nm.

Figure 3C:
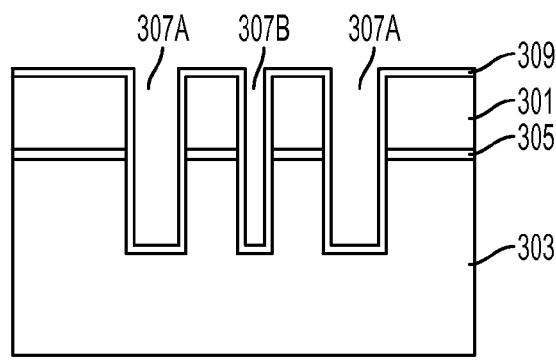

As shown in FIG. 3C, a thin liner 309, e.g., of SiN, may be conformally deposited over the entire wafer at a thickness of 2 nm to 3 nm. Liner 309 may be formed, for example, of iRAD SiN, which has excellent step coverage and uniformity. Liner 309 will protect the sidewalls of STI trenches 307B near PMOS and NMOS diffusions close to the top surface of substrate 303 during later ion implantation.

Figure 3D:
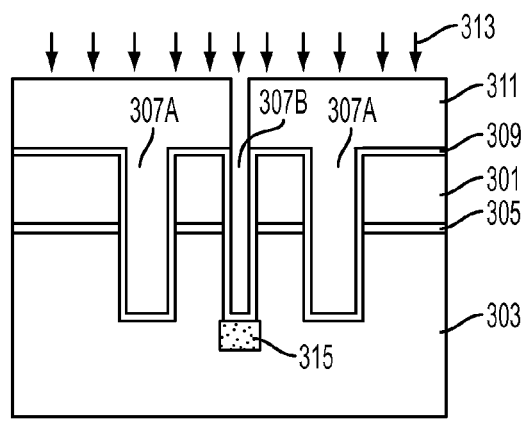

Adverting to FIG. 3D, a photoresist 311 is formed and lithographically patterned to form openings over STI trenches 307B at critical leakage paths, such as at well boundaries, where extra isolation is required. For STI features not at critical leakage paths, STI trenches 307A may be filled and covered with photoresist 311 to prevent the STI regions from being deepened, so that the well resistance will not be reduced. Then, oxygen, i.e., $O^+$ ions 313, are ion implanted in the substrate below STI trenches 307B to form oxygen implanted silicon regions 315. The oxygen may be implanted with a multiple energy implant. The implant energy may range from 5 keV to 20 keV, which is significantly lower than the 70 keV to 200 keV required for a conventional separation by implantation of oxygen (SIMOX) process for forming a buried oxide layer under the active silicon layer. Similarly, implant doses may range from 1E16 $cm^2$ to 1E17 $cm^2$, as opposed to doses of at least 5E17 $cm^2$ for SIMOX formation. Doped silicon regions 315 may be formed to a depth of 20 to 40 nm, for example 40 nm, below the bottom of STI trenches 307B.

Figure 3E:
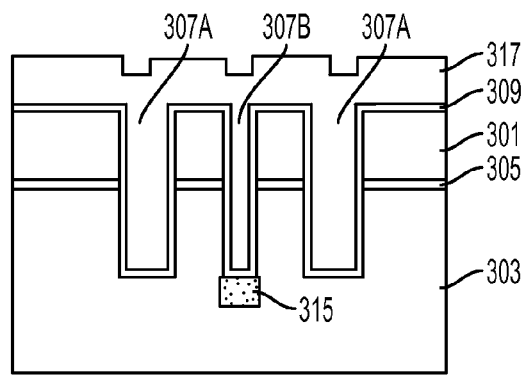

After oxygen implantation is complete, photoresist 311 may be removed, and STI trenches 307A and 307B may be filled with an oxide 317, substantially by conventional STI processing. The result of the oxide fill is illustrated in FIG. 3E.

Figure 3F:
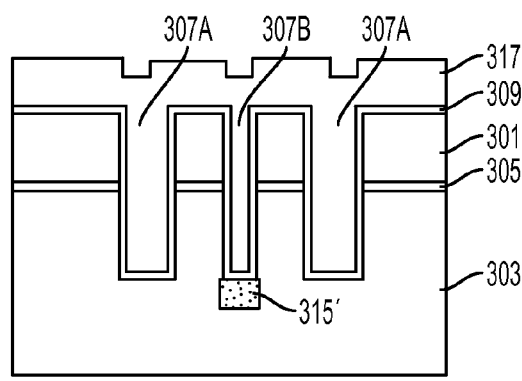

As illustrated in FIG. 3F, a high temperature thermal anneal, for example at a temperature of 1200° C. to 1400° C., in an inert ambient is performed to convert the oxygen implanted silicon 315 to silicon dioxide 315'.

Figure 3G:
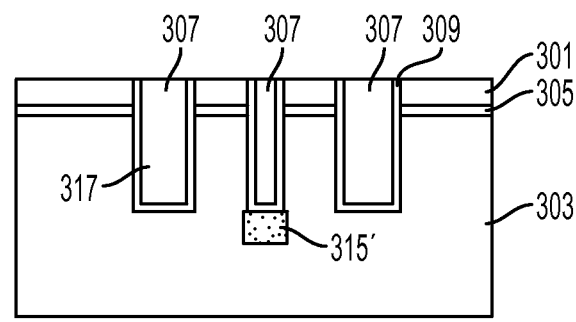
Figure 3H:
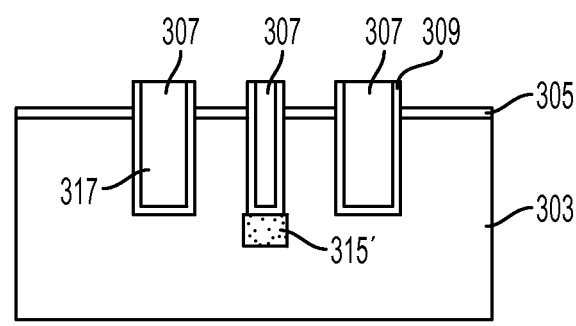

Adverting to FIG. 3G the STI oxide 317 is chemical mechanical polished (CMP), stopping on SiN capping layer 301. Then, the remaining SiN capping layer 301 is removed, for example by wet etching, as illustrated in FIG. 3H. The PMOS and NMOS devices may then be formed on silicon substrate 303, separated by the extended STI regions.

The embodiments of the present disclosure can achieve several technical effects, including suppressed leakage current across isolation wells without etching and filling STI regions with extremely high aspect ratios, thereby avoiding STI voids and other defects. The present disclosure enjoys industrial applicability in any of various types of highly integrated semiconductor devices such as SRAMs, logic devices, and IO devices, particularly 22 nanometer (nm) node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a semiconductor device, the method comprising:
    forming a first well in a silicon substrate;
    forming a second well, different from the first well, in the silicon substrate;
    forming a first recess in the silicon substrate between the first and second wells and a second recess in the silicon substrate in one of the first and second wells;
    filling the second recess with a resist;
    implanting oxygen into the silicon substrate below the first recess, but not the second recess;
    removing the resist from the second recess;
    filling the first recess and the second recess with an oxide; and
    annealing the oxygen implanted silicon.

2. The method according to claim 1, comprising forming a liner on the sides and bottom of the first recess and the second recess before filling the second recess with a resist.

3. The method according to claim 2, comprising:
    forming a capping layer on the substrate prior to forming the first recess and the second recess; and
    forming the first recess and the second recess in the capping layer and the substrate.

4. The method according to claim 1, comprising:
    chemical mechanical polishing (CMP) the oxide subsequent to annealing; and
    removing the capping layer.

5. The method according to claim 4, comprising forming the first recess and the second recess by etching to a depth of 225 nanometers (nm).

6. The method according to claim 5, comprising implanting oxygen to a depth of 20 nm to 50 nm below the first recess.

7. The method according to claim 1, comprising annealing at a temperature of 1200° C. to 1400° C.

8. The method according to claim 1, comprising implanting oxygen at an energy of 5 keV to 20 keV.

9. The method according to claim 8, comprising implanting oxygen at a dose of 1E16 cm2 to 1E17 cm2.

10. The method according to claim 1, comprising depositing a liner of silicon nitride at a thickness of 2 nm to 3 nm in the first recess and the second recess prior to filling the second recess with a resist.

11. The method according to claim 10, comprising conformally depositing the liner on the substrate and in the first recess and the second recess.

12. A method of fabricating a semiconductor device, the method comprising:
    forming an N+ diffusion in a P-well in a silicon substrate;
    forming a P+ diffusion in an N-well in the substrate, closely spaced from the N+ diffusion;
    forming a first recess in the substrate to a depth of 225 nm between the P-well and the N-well;
    forming a second recess in the substrate in the P-well or in the N-well;
    filling the second recess with a resist;
    forming a liner on the sides and bottom of the first recess;
    implanting oxygen into the substrate only through the bottom of the first recess;
    removing the resist from the second recess;
    filling the first recess and the second recess with an oxide; and
    annealing the oxygen implanted silicon.

13. The method according to claim 12, comprising implanting the oxygen to a depth of 20 nm to 50 nm below the first recess.

14. The method according to claim 12, comprising annealing at a temperature of 1200° C. to 1400° C.

15. The method according to claim 12, comprising implanting oxygen at an energy of 5 keV to 20 keV and at a dose of 1E16 cm2 to 1E17 cm2.

16. The method according to claim 12, comprising conformally depositing a liner of silicon nitride at a thickness of 2 nm to 3 nm on the substrate and in the first recess and the second recess.

* * * * *